United States Patent [19]

Chaussy et al.

[11] 4,074,343
[45] Feb. 14, 1978

[54] ELECTRIC CURRENT CHOPPER

[75] Inventors: Jacques Chaussy; Jean-Louis Bret; Adrien Berton; Jacques Odin, all of Grenoble, France

[73] Assignee: Agence Nationale de Valorisation de la Recherche (ANVAR), Neuilly-sur-Seine, France

[21] Appl. No.: 734,093

[22] Filed: Oct. 20, 1976

[30] Foreign Application Priority Data

Oct. 22, 1975 France ................................ 75 32986

[51] Int. Cl.² .............................................. H02M 7/00
[52] U.S. Cl. ...................................... 363/14; 307/240; 307/245
[58] Field of Search ............... 307/245, 306, 212, 240, 307/311, 307; 321/8 R, 8 C, 43, 44; 338/32 S; 363/14, 124

[56] References Cited

U.S. PATENT DOCUMENTS

| 2,878,442 | 3/1959 | McKenney | 323/75 N |
| 3,292,160 | 12/1966 | Crittenden, Jr. | 307/306 X |
| 3,356,924 | 12/1967 | Buchhold | 307/306 X |
| 3,956,727 | 5/1976 | Wolf | 307/306 X |

OTHER PUBLICATIONS

"Polarity Converter", W. Kotyczka, C. Schuenemann, P. Wolf, IBM ® Technical Disclosure Bulletin, vol. 18, No. 12, May, 1976.

Primary Examiner—William M. Shoop
Attorney, Agent, or Firm—Fleit & Jacobson

[57] ABSTRACT

Apparatus for electrically chopping a direct current signal by controlling the superconductivity state of resistance elements contained within a cryostat. The resistance elements are in a bridge arrangement and the control is provided by laser diodes also contained within the cryostat.

10 Claims, 3 Drawing Figures

ELECTRIC CURRENT CHOPPER

BACKGROUND OF THE PRESENT INVENTION

It is well known to use specialized circuits, commonly called choppers, to periodically break a direct current signal and thereby supply an alternating current having the same voltage and amperage as the direct current signal. By use of these choppers it is possible to amplify a direct current or continuous signal by the use of conventional alternating current amplifiers. This permits the main parameters of the signals to be accurately measured without the use of direct current amplifiers because, as is well known, the disadvantages of direct current amplifiers are many. Various schemes have been proposed to accomplish this chopping function; for example, hard switching by mechanical relays driven by a rotating disc between a photo cell and light source to produce the desired square wave chopping, and soft switching of the direct current wave by the use of a transistor or a silicon controlled rectifier. At the present time a major problem which is present in many choppers is the existence of parasitic thermo-electric noise. In an attempt to eliminate this noise, nonmechanical choppers operating at extremely low temperatures have been designed utilizing the principle of superconductivity, which is a property of many conductors, including metals. In these superconductivity systems, chopping is provided by making a resistance alternately superconductive and nonsuperconductive. Such alternating between conductive states may be achieved by the use of a magnetic field which operates to cancel the superconductivity property, or by a periodically varying thermal means. Such thermal means may operate by simply heating and cooling a resistance periodically. It has also been suggested that the resistance could be subjected to electro-magnetic radiation, such as light, and that it would absorb the radiation and transform it into heat. In this way the superconductivity property could be varied to provide the required chopping. However, devices and circuits of this type have proven to be extremely complicated and do not provide the necessary high impedance during the nonsuperconductivity periods which is required in many applications to prevent loading.

It is therefore an object of the present invention to provide a chopper circuit having a superconductivity control means which utilizes a light beam.

It is a further object of the present invention to provide a chopper circuit having low parasitic thermo-electric noise.

It is a still further object of the present invention to provide a superconductivity chopper circuit which is simple and relatively small and utilizes no external optical apparatus.

SUMMARY OF THE INVENTION

The present invention provides apparatus which is a superconductivity chopper system utilizing a control circuit made up of electroluminescent diodes placed directly in a cryostat. It is understood that in this case a cryostat is the extremely low-temperature enclosure containing the resistance which is having its temperature modulated. The resistance is made up of a very thin layer of high resistivity material which will provide superconductivity at a temperature slightly higher than that which is present in the cryostat. The resistivity material is applied to a substrate in a zigzag pattern. This resistivity material may also be applied in an interdigitated array. It has been found that niobium carbonitride provides a suitable resistivity material. Certain other complex oxides are also suitable, and one may be represented by the formula $Li_{0.8} Ti_{2.2} O_4$. A suitable substrate has been found to be a thin glass plate, such as a cover slide. The resistivity material is arranged in a four component bridge pattern and two electroluminescent diodes are arranged to illuminate opposite sides of the bridge. The bridge pattern is then arranged on the glass substrate such that a pair of bridge components are arranged on the left and right sides of the substrate. These electroluminescent diodes must provide an extremely high yield so that their operation does not involve producing excessive heat in the cryostat. It has been found that laser diodes provide the best performance. Laser diodes are well known and may be comprised of either gallium arsenide, indium arsenide or gallium arsenide phosphide.

DETAILED DESCRIPTION OF THE PREFERRED EMBODIMENT

Figure 1:
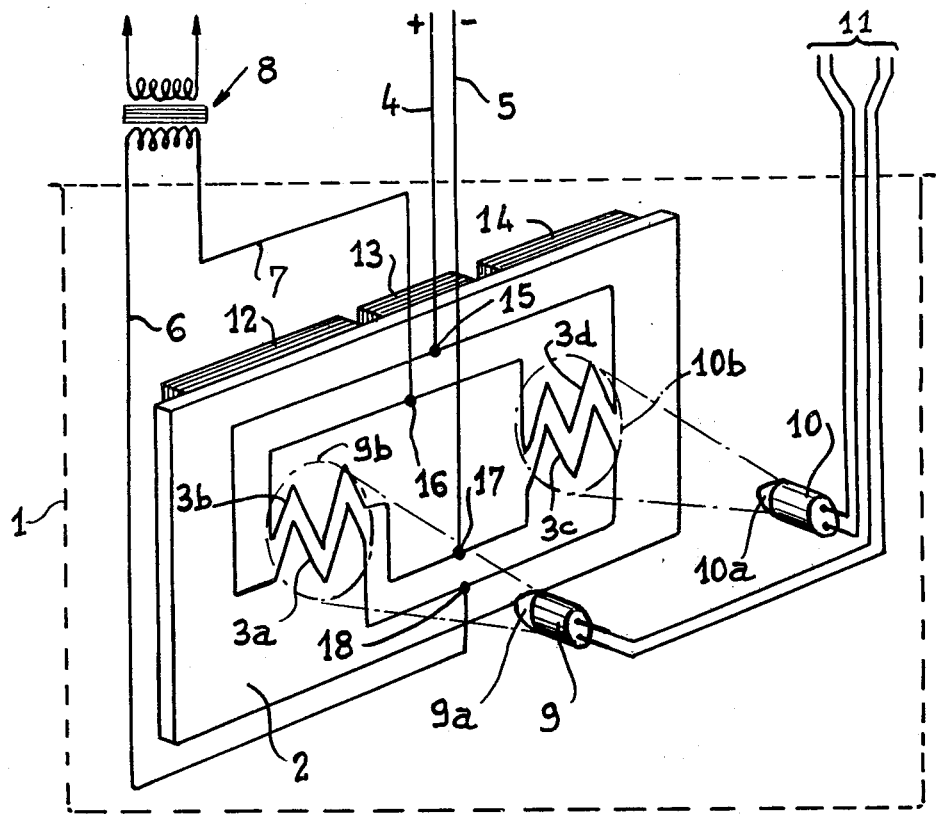
FIG. 1 is combination perspective and circuit diagram showing the preferred embodiment of the present invention.

Referring now to FIG. 1, a simplified presentation of a cryostat is shown enclosed in the dashed line at 1. The dashed line serves to represent a Dewar flask which is under a vacuum and contains liquid helium with the present invention immersed in the helium. In this way a cryostat, suitable for use in the present invention, will maintain a temperature of approximately 4.2° K, which is helium's boiling point at the pressure of one atmosphere. A glass plate 2 is utilized as the substrate and upon this substrate has been deposited an appropriate resistance material in accordance with a predetermined pattern. Similarly, the entire surface could be coated with the resistance material and the specified pattern could be etched into the resistance material. In this preferred embodiment the resistance material pattern provides four resistance components shown at 3a, 3b, 3c, and 3d. These resistance components are arranged into sets, the first set being 3a and 3b and the second set being 3c and 3d. The direct circuit signal which is desired to be chopped is fed into the system of the present invention on conductors 4 and 5. Two output conductors 6 and 7 are provided to form a link with a transformer 8 which is external to the embodiment of the present invention but may preferably be in the cryostat with its secondary leading to the alternating circuit amplifying system.

Figure 2:
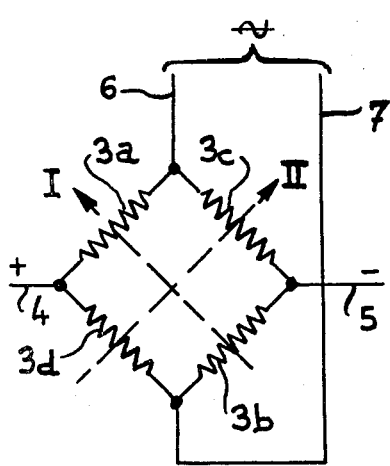
FIG. 2 is a schematic of the bridge circuit pattern utilized in the embodiment of FIG. 1.

FIG. 2 is a circuit diagram which shows more clearly the electrical arrangement of the resistances 3a, 3b, 3c, 3d which are arranged on the glass substrate 2 of FIG. 1. The positive input conductor 4 is connected to a point on the bridge which is between resistance 3a and 3d and the negative input conductor 5 is connected to a point on the bridge between resistance 3c and 3b. Similarily the leads 6, 7 to the transformer 8 carrying the alternating current signal are connected at points between resistances 3a and 3c, and 3b and 3d. In this way the four resistance components make up a bridge network composed of two sets, 3a, 3b and 3c, 3d, as shown by the arrows I and II in FIG. 2.

Figure 3:
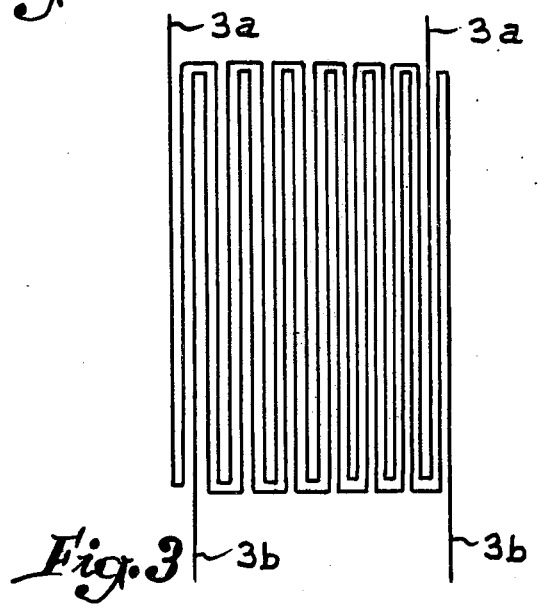
FIG. 3 is a plan view showing an overlapping pattern of the interdigitated resistance material.

As seen from FIG. 1, the resistance components of each set I and II are made by depositing resistance material on the plate 2 in a closely arranged, zigzag pattern. A preferable resistance material has been found to be niobium carbo-nitride and, in the preferred embodiment, it is shown deposited as thin conducting areas on the substrate 2. However, as mentioned above, it is possible to begin with a layer of the resistance material totally covering the substrate and then etch the required seperating lines into the resistance material. An alternate embodiment of the resistance pattern forming the bridge is shown in FIG. 3. As can be seen each resistance component is made up a series of tooth patterns with a width which is very small compared to the distance separating the two patterns. In this manner an efficient interdigitated comb pattern may be provided.

Referring once again to FIG. 1, opposite or facing each resistance group pattern is an electroluminescent diode 9 and 10. These diodes are preferably of the laser type, such as gallium arsenide. Each diode is associated with a lens element shown at 9a and 10a which will provide the required divergent beam to produce a circular spot of electromagnetic radiation shown at 9b and 10b. These circular spots of electromagnetic radiation then impinge on the substrate 2 in the area of the resistance groups I and II. The diodes are connected to a suitable external power source by a conductors 11. In order to provide the required thermal stability, additional thermal masses are provided and are shown at 12, 13 and 14 located on the back side of the substrate 2. These thermal masses are preferably constructed of a plurality of thin metal layers. Thermal mass 12 is located behind resistances 3a and 3b and thermal mass 14 is located behind resistances 3c and 3d to expedite their cooling after they have been illuminated by the laser diodes. The masses 12 and 14 are separated by a fixed distance and there is no risk of heat transfer from one thermal mass to the other. An additional thermal mass 13 may also be placed between the two resistance groups on the opposite sides of the substrate so that any local heating is avoided which might give rise to the unwanted parasitic noise.

In the preferred operation of the present invention the resistance materials should have a superconductivity threshold which is slightly above the temperature being maintained in the cryostat. For example the niobium carbonitride has a superconductivity threshold which is approximately 6° K while the bath is being maintained at 4.2° K by the liquid helium. It has been found that under the preceding conditions when energizing one of the diodes 9 or 10 the radiation which it emits is sufficient to place the appropriate bridge portion above its superconductivity threshold. Upon turning off the laser diodes 9 or 10 the thermal masses 12 and 14 serve to cool the portions of the bridge and the helium bath lowers the temperature so that the resistance components once again become superconductors. By using a suitably thin glass substrate 2 and a resistance layer which is as thin as possible, it has been found that the transition time from one conductivity state to another is on the order of a few milliseconds. In this way by alternately energizing the two diodes 9 and 10 the bridge shown in FIG. 2 can be operated as the reverse of a Graetz rectifier bridge having a frequency on the order of 100 Hz, which has proven quite adequate for the practical purposes.

While it is shown that the elimination of heat from the substrate may be accomplished by the use of thermal masses 12, 13 and 14, such elimination of heat may be accomplished by merely placing the glass plate in contact with the wall of the cryostat which is itself cooled to an extremely low temperature by the helium bath. Similarly, it has been found to be possible to further reduce the transistion time between states, and to thereby increase the boundary frequency of operation, by using a substrate 2 which is formed of a material having a higher diffusivity than glass. Additionally, the energy consumption of the diodes which is finally translated into a heating of the liquid helium may be reduced by providing a resistance component formed of a thin layer of material which has a high optical absorption. For example, the complex oxide mentioned above, $Li_{0.8}Ti_{2.2}O_4$.

It is understood of course that the preceding description is given only by way of example and that it does not limit in any way the field of the invention and that the elements may all be replaced by their equivalents.

What is claimed is:

1. An electric current chopper for use with a cryostat, comprising resistance means having at least one superconductivity resistance component adapted to be maintained in the cryostat slightly below its superconductivity threshold and a controlled electroluminescent diode placed inside the cryostat for periodically emitting a light beam for heating the resistance component above its threshold.

2. A chopper in accordance with claim 1, wherein the diode is of the laser type.

3. A chopper in accordance with claim 1, wherein the resistance means includes a very thin insulation plate, the resistance component being arranged in a close zigzag pattern and being deposited on the very thin insulation plate.

4. A chopper in accordance with claim 3, wherein the resistance component is made of niobium carbo-nitride.

5. A chopper in accordance with claim 3, wherein the resistance component is made of a complex oxide of the type $Li_{0.8}Ti_{2.2}O_4$.

6. A chopper in accordance with claim 1 wherein the resistance means includes an insulating plate and the resistance component is supported on the front side of the insulation plate and wherein a thermal mass is located within the cryostat against the reverse side of the insulating plate facing the resistance component to accelerate its cooling.

7. A chopper, in accordance with claim 3 wherein the resistance means further includes conductors connected to the resistance component at linking points and wherein a thermal mass is located against the reverse side of the insulating plate facing the linking points to maintain the temperature of these points and to avoid any phenomenon involving parasite thermo-electric voltage.

8. A chopper in accordance with claim 1 wherein the resistance means includes four components of resistance arranged in a bridge pattern, each of the pairs of components matching the opposite sides of the bridge and making up a set, and wherein two electroluminescent diodes are provided, each diode acting on a respective one of the two sets.

9. A chopper in accordance with claim 3, wherein the resistance means includes four resistance components arranged in sets, each set of two resistance components being arranged in the form of two sets of rectilinear zigzags in the shape of a comb with teeth not as wide as the spaces between them, said two sets being overlapping in such a manner that the teeth of one are placed in the spaces of the other.

10. A chopper in accordance with claim 6 wherein the thermal mass is in contact with and cooled by a wall of the cryostat.

* * * * *